United States Patent [19]
Ogawa

[11] Patent Number: 5,406,103
[45] Date of Patent: Apr. 11, 1995

[54] SEMICONDUCTOR MEMORY DEVICE WITH STACKED CAPACITOR ABOVE BIT LINES

[75] Inventor: Hisashi Ogawa, Osaka, Japan

[73] Assignee: Matsushita Electric Industrial Co., Ltd., Osaka, Japan

[21] Appl. No.: 187,020

[22] Filed: Jan. 26, 1994

[30] Foreign Application Priority Data

Feb. 1, 1993 [JP] Japan .................. 5-014508

[51] Int. Cl.6 .................................... H01L 29/68
[52] U.S. Cl. ............................ 257/306; 257/296
[58] Field of Search ............ 257/306, 307, 308, 296

[56] References Cited

U.S. PATENT DOCUMENTS 5,104,822  4/1992  Butler ........................... 437/52
5,200,635  4/1993  Kaga et al. .................... 257/306

Primary Examiner—Robert P. Limanek
Attorney, Agent, or Firm—Willian Brinks Hofer Gilson & Lione

[57] ABSTRACT

After a word line is formed on a semiconductor substrate, a side-wall insulating film is formed on the side faces of the word line. Subsequently, a first insulating film is deposited thereon. The resulting first insulating film is formed with an opening for a bit line, through which a bit line having an on-bit-line insulating film on its top surface is formed. Thereafter, a second insulating film is deposited thereon. An opening for a charge-storage electrode is then formed in the first and second insulating film by removing, by a specified thickness, the portions of the first insulating film, on-bit-line insulating film, and second insulating film lying in a memory cell array region, followed by the deposition of a charge-storage electrode through the opening for a charge-storage electrode.

1 Claim, 15 Drawing Sheets

SEMICONDUCTOR MEMORY DEVICE WITH STACKED CAPACITOR ABOVE BIT LINES

BACKGROUND OF THE INVENTION

The present invention relates to a semiconductor memory device and, more particularly, it relates to a stack-type DRAM (Dynamic Random Access Memory) device having a charge-storage electrode above its bit lines.

Among semiconductor memory devices in which higher integration has been pursued, DRAMs require the finest processing techniques. To obtain sufficient capacitance for storing charge, DRAMs use trench-type cells having charge-storage electrodes which are formed in trenched portions of the semiconductor substrate or stack-type cells having charge-storage electrodes which are stacked three-dimensionally on the semiconductor substrate. As smaller features are defined in a stack-type cell, the charge-storage electrodes formed therein inevitably extend upward in order to obtain sufficient charge-storage capacitance.

However, with lithographic techniques for forming patterns, the depth of focus becomes shallower as the resolution limit becomes smaller. In general, the resolution limit is proportional to the wavelength of the light source in use, while it is inversely proportional to the numerical aperture of the lens of an aligner. To form a micropattern, therefore, it is necessary to use a shorter wavelength for the light source or to increase the numerical aperture of the lens.

On the other hand, since the depth of focus is proportional to the wavelength of the light source, while it is inversely proportional to the square of the numerical aperture of the lens, the depth of focus becomes shallower as the resolution limit becomes smaller. To form a micropattern, therefore, it is necessary to minimize the difference in level of the semiconductor substrate.

Below, a method of manufacturing a DRAM which uses the conventional stack-type cells mentioned above will be described with reference to drawings.

FIGS. 12 to 15 are cross sections illustrating steps according to the method of manufacturing the DRAM device using the conventional stack-type memory cells. In the drawings, 5 denotes a gate electrode which is connected to the word line, 9 denotes a bit line, and 14 denotes a charge-storage electrode.

First, as shown in FIG. 12, an insulating film for isolation 2 is formed on a p-type semiconductor substrate 1. Then, a gate insulating film 4 constituting a switching transistor, the gate electrode 5 connected to a word line, an on-gate insulating film 6, and a side-wall insulating film 7 are sequentially formed. Thereafter, the bit line 9 is formed on the side faces of the gate electrode 5, followed by the deposition of a first BPSG film 18 serving as an insulating film. The resulting first BPSG film 18 is annealed for planarization by using a reflow technique. Subsequently, a resist pattern 12 is deposited on the first BPSG film 18 so that an opening 13 for a charge-storage electrode 13 (See FIG. 13), which will be described later, is formed above the other n-type diffused region 3b.

Next, as shown in FIG. 13, the opening 13 for a charge-storage electrode is formed in the first BPSG film 18 by using the resist pattern as the etching mask, followed by the deposition of the charge-storage electrode 14 through the opening 13 for a charge-storage electrode 14.

Next, as shown in FIG. 14, a capacitance insulating film 15 consisting of multiple layers of a silicon nitride film and a silicon dioxide film, and a plate electrode 16 are formed over a memory cell array region 40.

Next, as shown in FIG. 15, after a second BPSG film 19 is deposited as an interlayer insulating film, the second BPSG film 19 is annealed for planarization by using a reflow technique, thereby reducing the maximum tilt angle of a step region 50 of the second BPSG film 19 between the memory cell array region 40 and a peripheral circuit region 30.

In a 64M-bit DRAM, for example, a storage capacitance of about 30 fF is required in order to obtain a satisfactory storage electrode. To meet the requirement, the charge-storage electrode 14 should be as high as about 800 nm in the case of using a capacitance insulating film having a memory cell area of 1.5 $\mu m^2$ and a thickness corresponding to 6 nm if calculated with a $SiO_2$ film.

However, with the foregoing structure, if a polycrystal silicon film having a thickness of 200 nm is used as the plate electrode 16, there arises a difference in level of about 1 $\mu m$, which is the sum of the height of the charge-storage electrode 14 of 800 nm and the film thickness of the plate electrode 16 of 200 nm, between the memory cell array region 40 and peripheral circuit region 30. Consequently, a sufficient planarizing effect is not obtained in the step region 50 only by making the second BPSG film 19 reflow.

This renders the subsequent formation of a wiring pattern thereon extremely difficult. Although a pattern as small as 0.35 $\mu m$ is required to be formed in the 64M-bit DRAM, the depth of focus becomes shallower as the pattern becomes smaller with a photolithographic technique, so that it becomes difficult to form a micropattern over a region with a large difference in level.

With the structure in which the charge-storage electrode 14 is formed above the bit line 9, the opening 13 for a charge-storage electrode should be formed in a small region between the bit lines 9 and between the gate electrodes 5 (word lines), so that high precision for mask alignment and a technique for forming a micropattern are required in the photolithographic process.

SUMMARY OF THE INVENTION

An object of the present invention, which was achieved in view of the foregoing, is to provide a semiconductor memory device and a method of manufacturing the same. In the semiconductor memory device, the difference in level and maximum tilt angle of a step region between a memory cell array region and a peripheral circuit region can be reduced even when a charge-storage electrode is formed high, so that the subsequent formation of a wiring pattern thereon can easily be performed and that a step of forming a planarized insulating film on the top surface of a bit line in order to reduce the above difference in level is no more necessary.

To attain the above object, a first method of manufacturing a semiconductor memory device according to the present invention aims at being a method of manufacturing a semiconductor memory device having a switching transistor provided with a pair of impurity diffused regions and with a gate electrode connected to a word line, a bit line, and a charge-storage electrode on its semiconductor substrate, comprising: a word-line forming step of forming a word line on the semiconductor substrate, said word line having an on-word-line insulating film on the top surface thereof; an impurity diffusing step of forming, in the semiconductor substrate, a pair of impurity diffused regions of conductivity type opposite to that of said semiconductor substrate; a side-wall insulating film forming step of forming a side-wall insulating film on the side faces of said word line; a first insulating film depositing step of depositing a first insulating film over the entire surface of the semiconductor substrate; a bit-line-opening forming step of forming an opening for a bit line in said first insulating film, through which the bit line is brought into contact with one of said pair of impurity diffused regions; a bit-line forming step of forming the bit line through said opening for a bit line, said bit line having an on-bit-line insulating film on the top surface thereof; a second insulating film depositing step of depositing a second insulating film over the entire surface of the semiconductor substrate; a charge-storage-electrode-opening forming step of forming an opening for a charge-storage electrode in said first and second insulating films, through which the charge-storage electrode is brought into contact with the other of said impurity diffused regions, by selectively removing, by a specified thickness, said first insulating film, on-bit-line insulating film, and second insulating film lying in a region in which at least the charge-storage electrode is formed; and a charge-storage electrode forming step of forming the charge-storage electrode through said opening for a charge-storage electrode.

Thus, the level of the insulating film is lowered by at least the foregoing specified thickness in the region in which at least the charge-storage electrode is to be formed. It follows that the difference in level between the charge-storage electrode formation region and its peripheral region, which was generated by forming the charge-storage electrode, is reduced by at least the foregoing specified thickness, so that the difference in level and maximum tilt angle of the step region between the charge-storage region and its peripheral region can be reduced even when the charge-storage electrode of simple structure is formed high.

Consequently, according to the first method of manufacturing a semiconductor memory device, the subsequent formation of a wiring pattern thereon can easily performed, while providing the charge-storage electrode with sufficient capacitance. Moreover, a step of forming the planarized insulating film on the top surface of the bit line in order to reduce the difference in level between the charge-storage electrode formation region and its peripheral region becomes unnecessary, which permits the formation of a shallow channel region in a small transistor and hence increases the degree of allowance in the process of forming isolations.

In the first method of manufacturing a semiconductor memory device, said region in which at least the charge-storage electrode is formed is an entire memory cell array region in which said word line, bit line, and charge-storage electrode are formed.

Thus, the formation of the charge-storage electrode has reduced the difference in level between the memory cell array region and its peripheral circuit region by at least the foregoing specified thickness. As a result, the structure of the resist pattern used for removing the insulating film by the specified thickness is simplified.

In the first method of manufacturing a semiconductor memory device, said second insulating film depositing step is preferably for depositing said second insulating film so that a space is formed between those adjacent word-line-side-wall portions of said second insulating film which are placed in a region in which the opening for a charge-storage electrode is formed, while a space is not formed between those adjacent word-line-side-wall portions of said second insulating film which are placed in a region, uncovered with said bit line, in which said opening for charge-storage electrode is not formed.

In the first method of manufacturing a semiconductor memory device, said second insulating film depositing step is preferably for depositing said second insulating film so that, a relation represented by $S2 < 2(t1+t2+t3) < S1$ is established among: the spacing $S1$ between those two adjacent ones of said word lines which are placed in a region in which said opening for a charge-storage electrode is formed; the spacing $S2$ between those two adjacent ones of said word lines which are not covered with said bit line and which are placed in a region in which said opening for a charge-storage electrode is not formed; the thickness $t1$ of said side-wall insulating film; the thickness $t2$ of said first insulating film; and the thickness $t3$ of said second insulating film.

In this manner, if the first insulating film, on-bit-line insulating film, and second insulating film are removed by the specified thickness, the opening for a charge-storage electrode through which the first and second insulating films are brought into contact with the semiconductor substrate and charge-storage electrode can surely be formed. Consequently, it becomes possible to form the opening for a charge-storage electrode by the self-aligning method without forming a micropattern through the photolithographic process.

The first method of manufacturing a semiconductor memory device preferably further comprises, prior to said word-line forming step, a substrate grooving step of preliminarily grooving a part of the surface of the semiconductor substrate, which is placed in the memory cell array region in which said word line, bit line and charge-storage electrode are formed.

Thus, the difference in level between the charge-storage electrode formation region and its peripheral region, which was generated by forming the charge-storage electrode, is reduced by the sum of the foregoing specified thickness of the insulating film removed and by the depth of the groove in the semiconductor substrate, so that the difference in level and maximum tilt angle of the step region between the charge-storage region and its peripheral region can be reduced furthermore.

A second method of manufacturing a semiconductor memory device according to the present invention aims at being method of forming a semiconductor memory device having a switching transistor provided with a pair of impurity diffused regions and with a gate electrode connected to a word line, a bit line, and a charge-storage electrode on its semiconductor substrate, comprising: a word-line forming step of forming a word line on the semiconductor substrate, said word line having an on-word-line insulating film on the top surface thereof; an impurity diffusing step of forming, in the semiconductor substrate, a pair of impurity diffused regions of conductivity type opposite to that of said semiconductor substrate; a side-wall insulating film forming step of forming a side-wall insulating film on the side faces of said word line; a first insulating film depositing step of depositing a first insulating film over the entire surface of the semiconductor substrate; a bit-line-opening forming step of forming an opening for a bit line in said first insulating film, through which the bit line is brought into contact with one of said pair of impurity diffused regions; a bit-line forming step of forming the bit line through said opening for a bit line, said bit line having an on-bit-line insulating film on the top surface thereof; a second insulating film depositing step of depositing a second insulating film over the entire surface of said semiconductor substrate so that a relation represented by $S2<2(t1+t2+t3)<S1$ is established among: the spacing $S1$ between those two adjacent ones of said word lines which are placed in a region in which said opening for a charge-storage electrode is formed; the spacing $S2$ between those two adjacent ones of said word lines which are not covered with said bit line and which is placed in a region in which said opening for a charge-storage electrode is not formed; the thickness $t1$ of said side-wall insulating film; the thickness $t2$ of said first insulating film; and the thickness $t3$ of said second insulating film; a charge-storage-electrode-opening forming step of forming an opening for a charge-storage electrode in said first and second insulating films, through which the charge-storage electrode is brought into contact with the other of said impurity diffused regions, by selectively removing, by a specified thickness, said first insulating film, on-bit-line insulating film, and second insulating film lying in a memory cell array region in which said word line, bit line, and charge-storage electrode are formed; and a charge-storage electrode forming step of forming the charge-storage electrode through said opening for a charge-storage electrode.

According to the second method of manufacturing a semiconductor memory device, the difference in level and maximum tilt angle of the step region between the charge-storage region and its peripheral region can be reduced even when the charge-storage electrode of simple structure is formed high. Moreover, the step of forming an interlayer insulating film for reducing the difference in level between the charge-storage electrode formation region and its peripheral region is not required any more, so that it becomes possible to provide the opening for forming the charge-storage electrode with a large degree of processing allowance without forming a micropattern through the photolithographic process.

A semiconductor memory device according to the present invention comprises a word line, bit line, and charge-storage electrode on its semiconductor substrate, wherein: an insulating film formed on the top surface of said bit line is formed with a step portion which is lower in level than other portions; and said charge-storage electrode is formed in said step portion.

Thus, the difference in level between the charge-storage electrode formation region and its peripheral region, which was generated by forming the charge-storage electrode, is reduced by the difference in level of the above insulating film. Consequently, even when the charge-storage electrode of simple structure is formed high, the difference in level and maximum tilt angle of the step region between the charge-storage region and its peripheral region can be reduced, so that the subsequent formation of a wiring pattern thereon can be performed easily, while providing the charge-storage electrode with sufficient capacitance.

DETAILED DESCRIPTION OF THE PREFERRED EMBODIMENTS

Below, a semiconductor memory device and a method of manufacturing the same according to the embodiments of the present invention will be described with reference to drawings.

EXAMPLE 1

Figure 8:
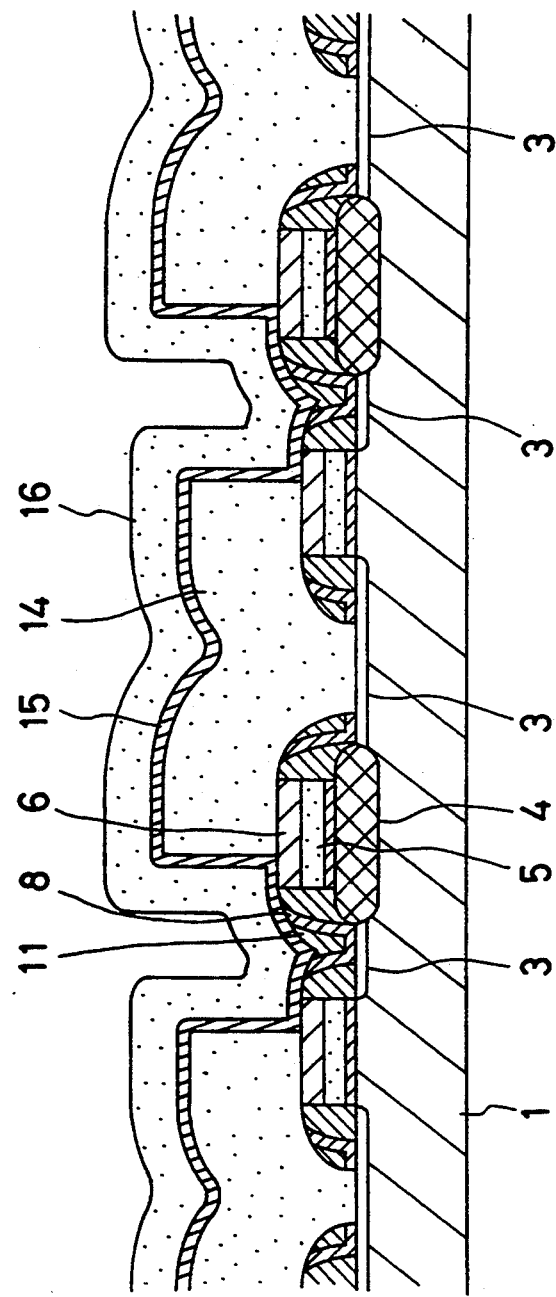
FIG. 8 is a cross section taken along the line B—B of FIG. 9, which illustrates still another step according to the method of manufacturing a semiconductor memory device in the above first embodiment.
Figure 9:
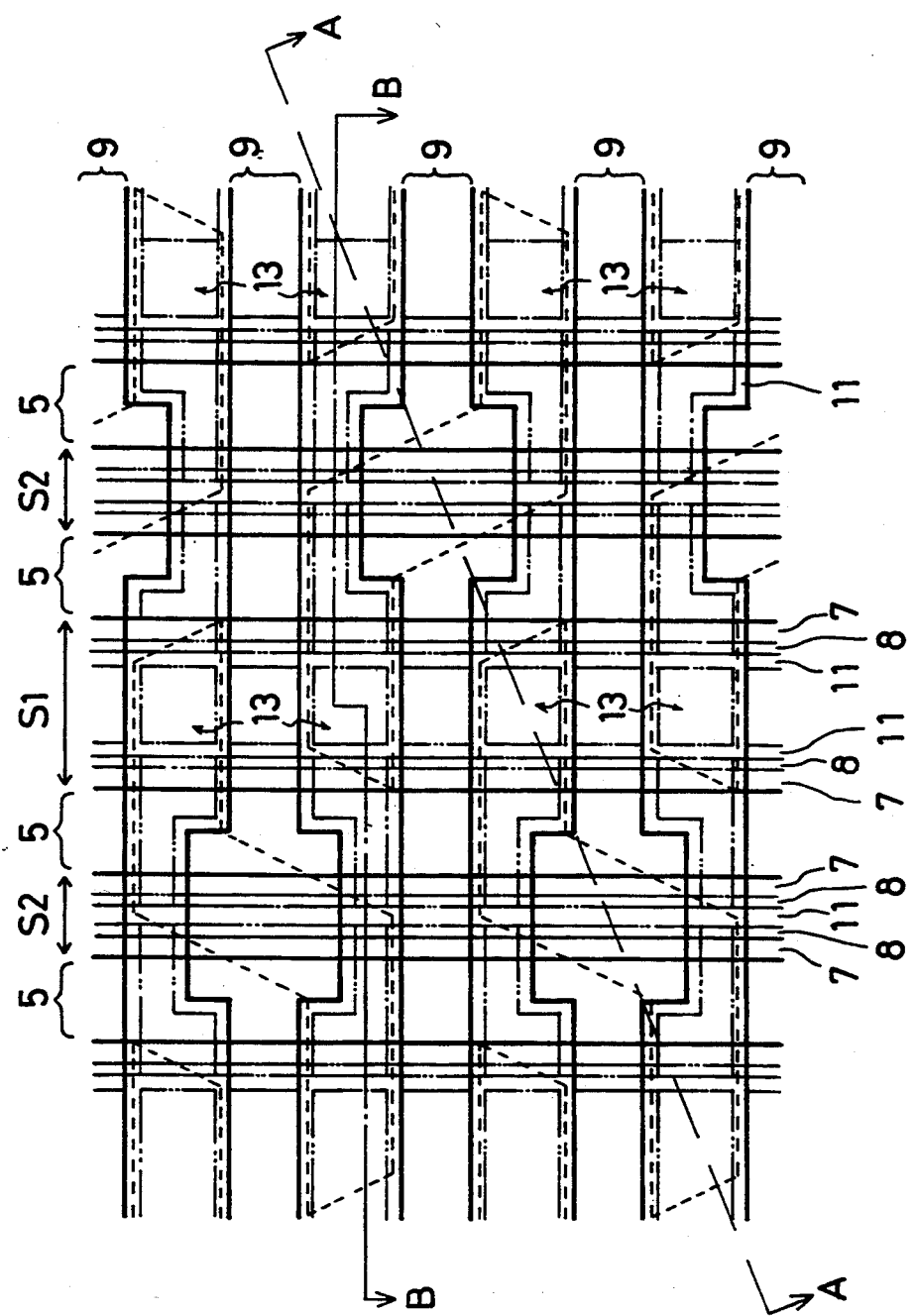
FIG. 9 is a plan view of a memory cell array in the semiconductor memory device according to the above first embodiment.

FIG. 9 is a plan view of a memory cell array in a semiconductor memory device obtained in an embodiment of the present invention. FIGS. 1 to 4 are cross sections taken along the line A—A of FIG. 9, which illustrate steps according to a method of manufacturing the semiconductor memory device in a first embodiment of the present invention. FIGS. 5 to 8 are cross sections taken along the line B—B of FIG. 9, which illustrate steps according to the above method of manufacturing a semiconductor memory device.

In FIG. 9, 7 denotes a side-wall insulating film formed on the side walls of a gate electrode 5 which will serve as a word line, 8 denotes a first insulating film formed beneath a bit line 9, 11 denotes a second insulating film formed between the bit line 9 and a charge-storage electrode 14 (See FIG. 2), and 13 denotes an opening for forming the charge-storage electrode. In the first embodiment, the gate electrodes 5 are provided so that a spacing S1 between those gate electrodes 5 which are uncovered with the bit line 9 and which are placed in a region in which the opening 13 for a charge-storage electrode is to be formed becomes 0.65 μm and a spacing S2 between those gate electrodes 5 placed in a region in which the opening 13 for a charge-storage electrode is not to be formed becomes 0.45 μm.

Figure 1:
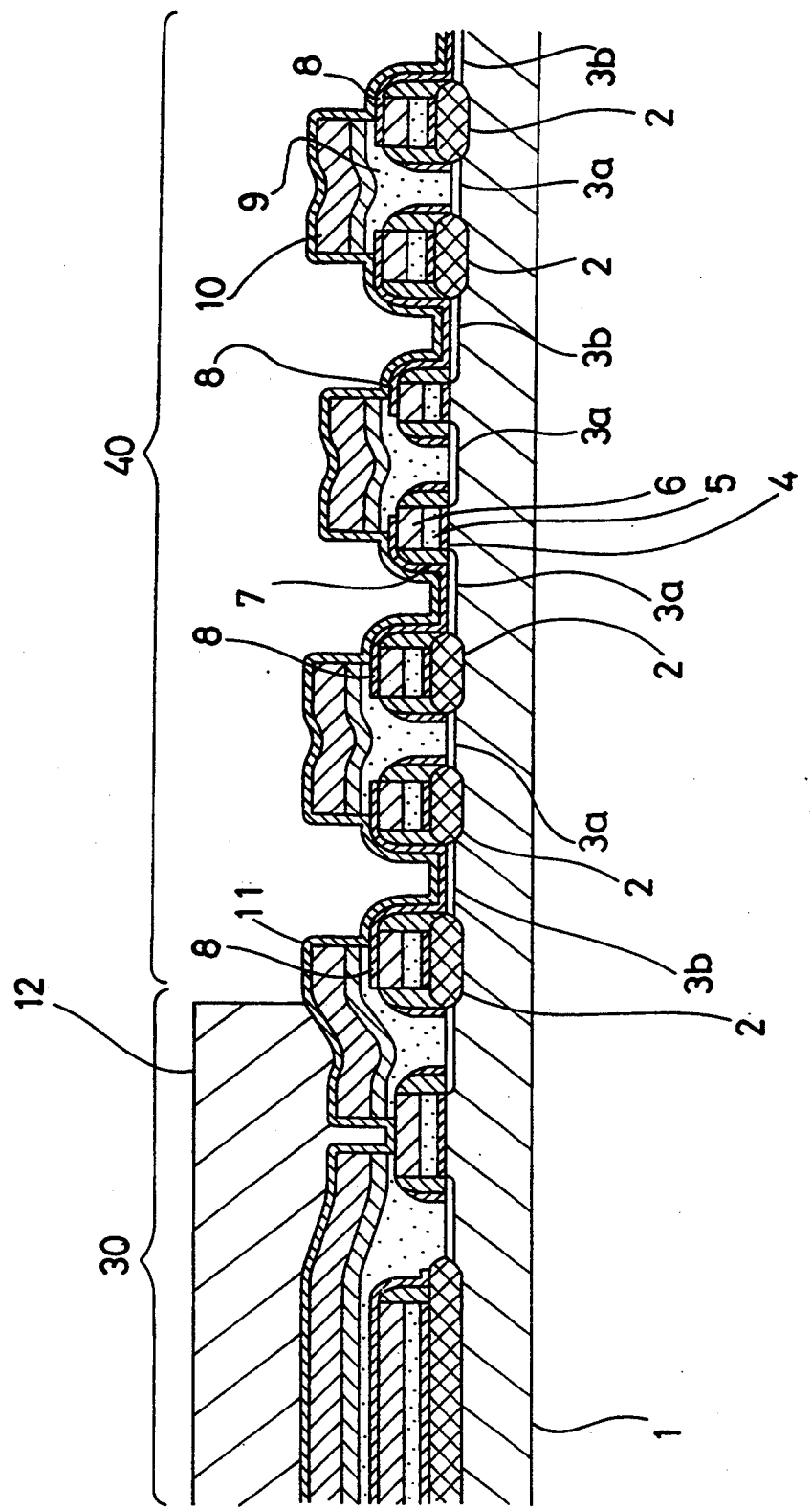
FIG. 1 is a cross section taken along the line A—A of FIG. 9, which illustrates a step according to a method of manufacturing a semiconductor memory device in a first embodiment of the present invention.
Figure 5:
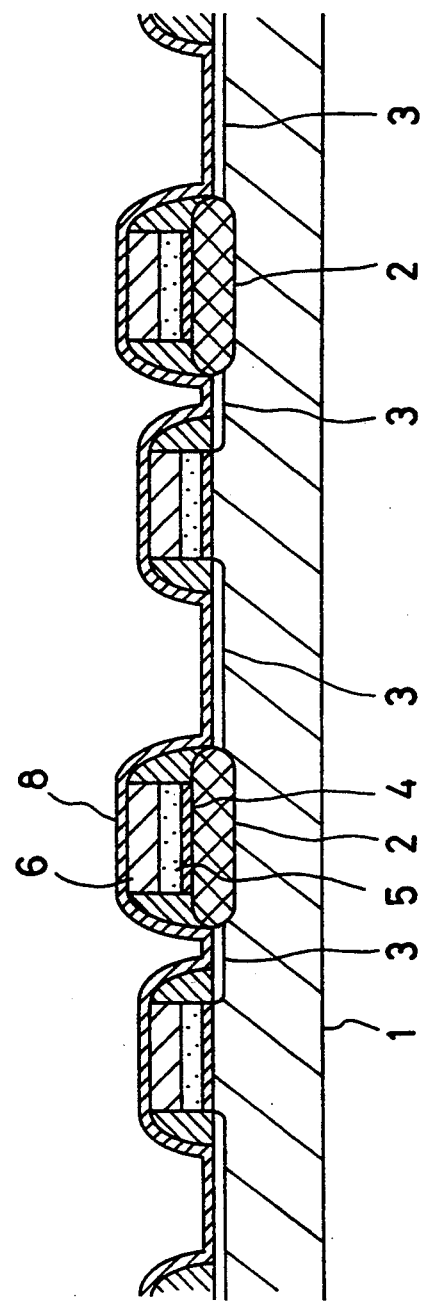
FIG. 5 is a cross section taken along the line B—B of FIG. 9, which illustrates still another step according to the method of manufacturing a semiconductor memory device in the above first embodiment.

As shown in FIGS. 1 and 5, an insulating film 2 for isolation composed of a silicon dioxide film is formed on a p-type semiconductor substrate 1 by a so-called LOCOS method, which is a well known technique. After that, the gate electrodes 5 having an on-gate insulating film 6 composed of a CVD silicon dioxide film (hereinafter referred to as HTO) having a film thickness of 280 nm is formed on the top surface of the insulating film 2 with the gate insulating film 4 interposed therebetween. Subsequently, n-type diffused regions 3, 3a, and 3b and a side-wall insulating film 7 for the gate electrode 5, which is composed of a HTO having the film thickness of t1=100 nm, are sequentially formed, followed by the deposition of the first insulating film 8 beneath a bit line, which is composed of a HTO having the film thickness t2=100 nm, over the entire surface of the topography. Thereafter, an opening for a bit line is formed in the first insulating film 8 over the n-type diffused region 3a by a so-called self-aligning contact-formation method. Then, the bit line 9 composed of tungsten polycide having an on-bit-line insulating film 10, composed of a HTO having the film thickness of 350 nm, on the top surface thereof is formed through the opening for a bit line.

Figure 6:
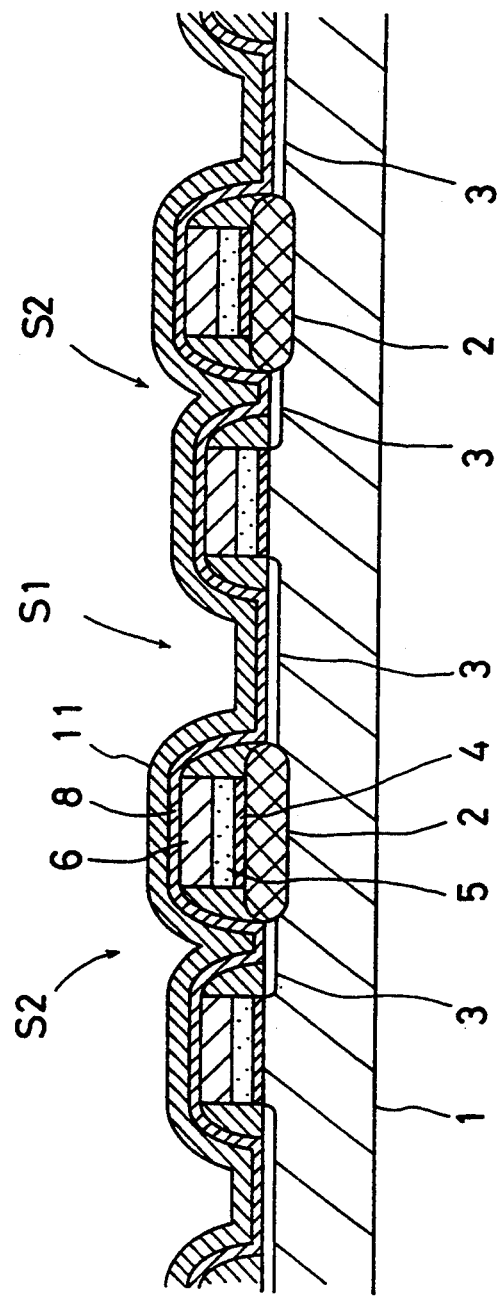
FIG. 6 is a cross section taken along the line B—B of FIG. 9, which illustrates still another step according to the method of manufacturing a semiconductor memory device in the above first embodiment.

Next, as shown in FIGS. 1 and 6, the second insulating film 11 composed of a HTO having the film thickness t3=100 nm is deposited over the entire surface of the p-type semiconductor substrate 1. Thus, a space is formed between those adjacent word-line side-wall portions of the second insulating film 11 which are placed in a region in which an opening 13 for a charge-storage electrode is to be formed (the region denoted by S1 in FIG. 6), while a space is not formed between those adjacent word-line side-wall portions of the second insulating film 11 which are placed a region, uncovered with a bit line 9, in which the opening 13 for a charge-storage electrode is not to be formed (the region denoted by S2 in FIG. 6). After that, as shown in FIG. 1, a resist pattern 12 for covering a peripheral circuit region 30 is formed on the second insulating film 11.

Figure 2:
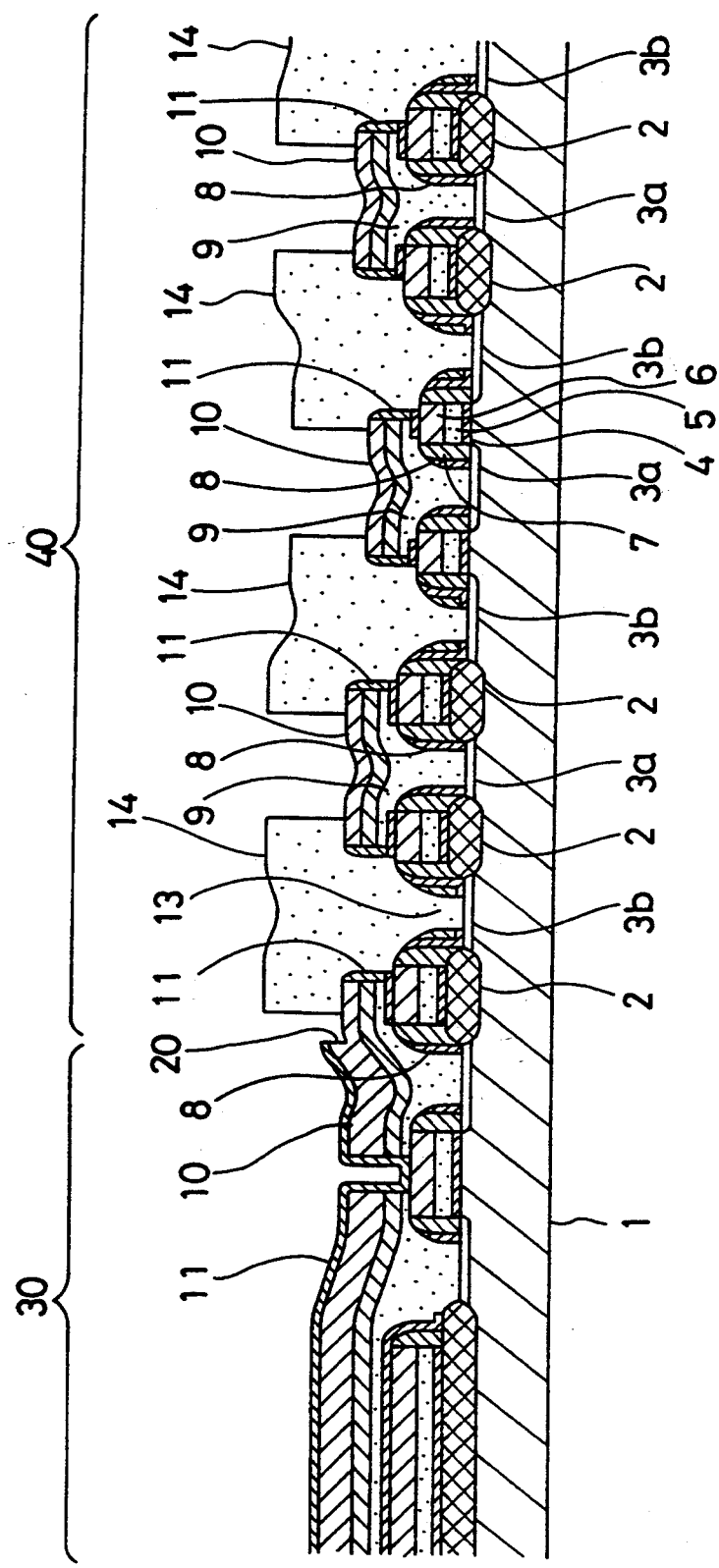
FIG. 2 is a cross section taken along the line A—A of FIG. 9, which illustrates another step according to the method of manufacturing a semiconductor memory device in the above first embodiment.
Figure 7:
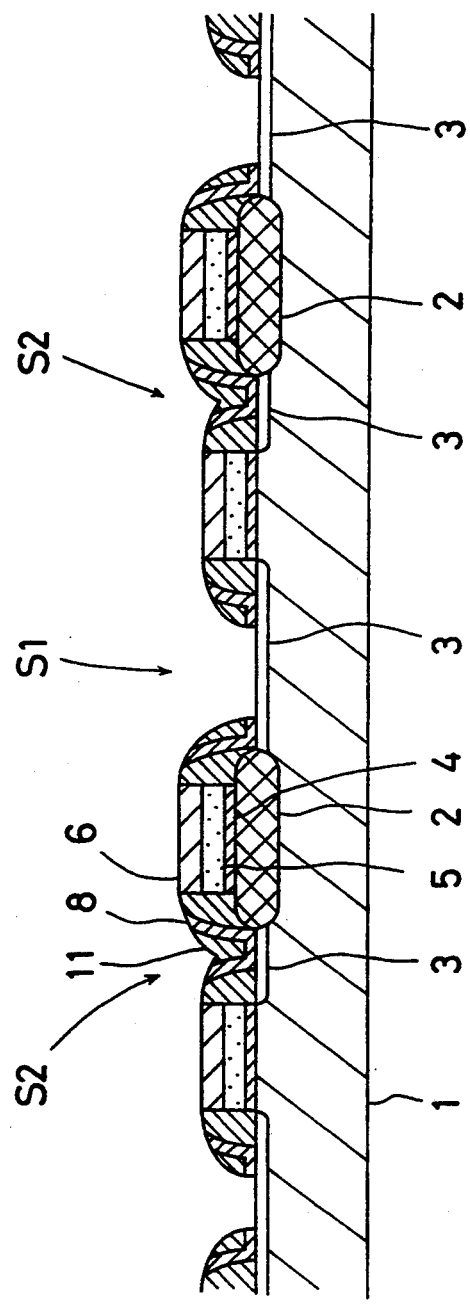
FIG. 7 is a cross section taken along the line B—B of FIG. 9, which illustrates still another step according to the method of manufacturing a semiconductor memory device in the above first embodiment.

Next, as shown in FIGS. 2 and 7, the entire first and second insulating films 8 and 11 are subjected to etching so that they are removed by a specified thickness, i.e., by at least the total thickness of the first and second insulating films 8 and 11 or more, thereby exposing the n-type diffused region 3b so that the opening 13 for a charge-storage electrode is formed. As described above, since a space is not formed between those adjacent word-line-side-wall portions of the second insulating film 11 which are placed in a region, uncovered with a bit line 9, in which an opening 13 for a charge-storage electrode is not to be formed (the region denoted by S2), the p-type semiconductor substrate 1 is not exposed in the region, as shown in FIG. 7, even when the foregoing etching process is performed so that the opening 13 for a charge-storage electrode is formed. Subsequently, the charge-storage electrode 14 composed of a p-doped polysilicon film having a thickness of 800 nm is deposited through the opening 13 for a charge-storage electrode.

As shown in FIG. 2, the thickness of the on-bit-line insulating film 10 lying in the memory cell array region 40 was reduced by at least the thickness t1 of the first insulating film 8 or more in the previous step. In the region between the memory cell array region 40 and peripheral circuit region 30 is formed a step portion 20 having a height corresponding to the sum of the thickness t1 of the first insulating film 8 and the thickness t2 of the second insulating film 11. In the first embodiment, the height of the step portion 20 is 180 nm or more, and it functions to reduce the difference in level produced by the charge-storage electrode 14. Accordingly, when the charge-storage electrode 14 having a height of 800 nm is formed, the difference in level equals to the difference in level obtained when the charge-storage electrode 14 having a height of 620 nm or less is formed by the conventional method.

Figure 3:
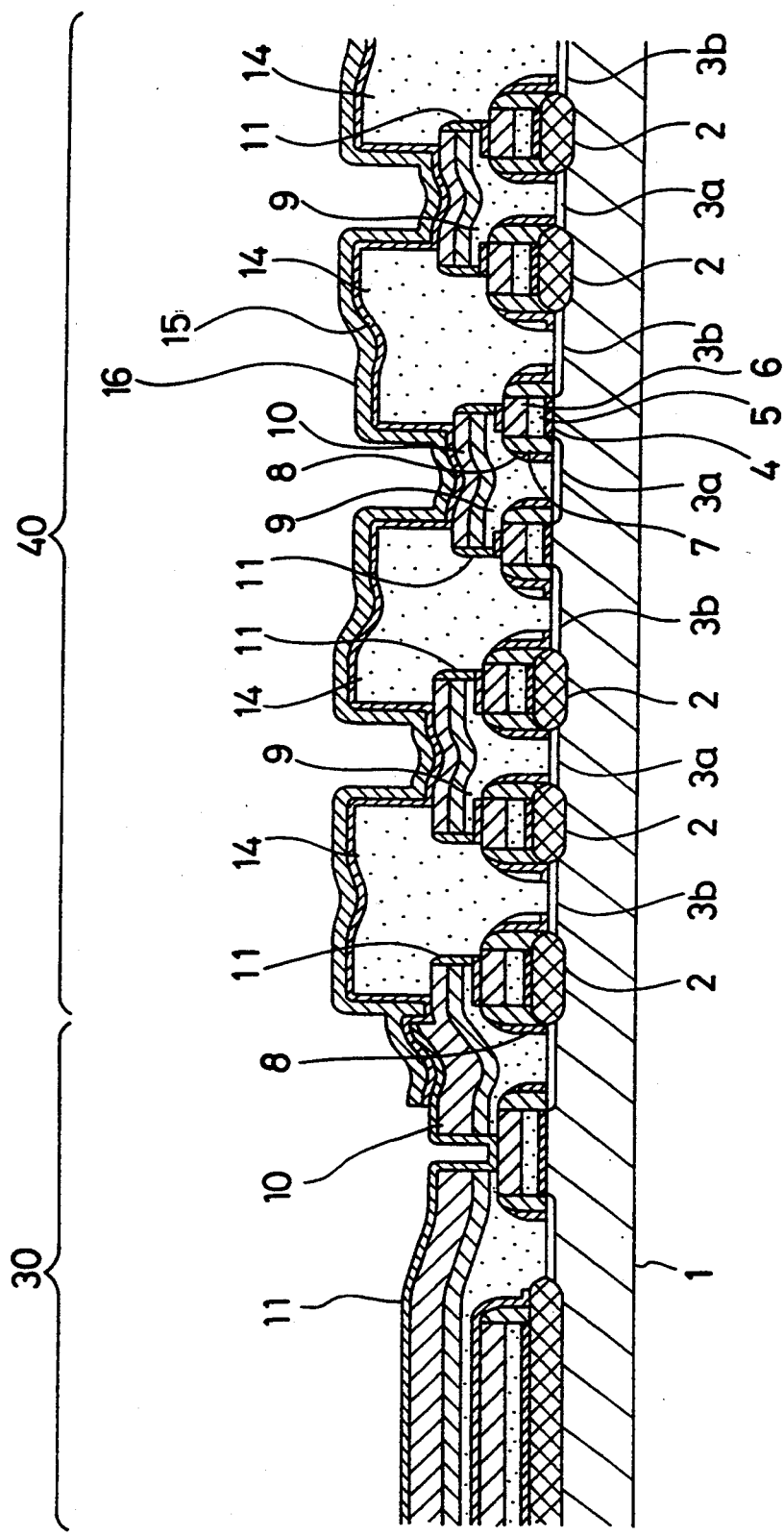
FIG. 3 is a cross section taken along the line A—A of FIG. 9, which illustrates still another step according to the method of manufacturing a semiconductor memory device in the above first embodiment.

Next, as shown in FIGS. 3 and 8, a capacitance insulating film 15 which is composed of a so-called ONO film consisting of a silicon nitride film and a silicon dioxide film is formed, followed by the formation of a plate electrode 16 composed of a polysilicon film having a thickness of 200 nm.

Figure 4:
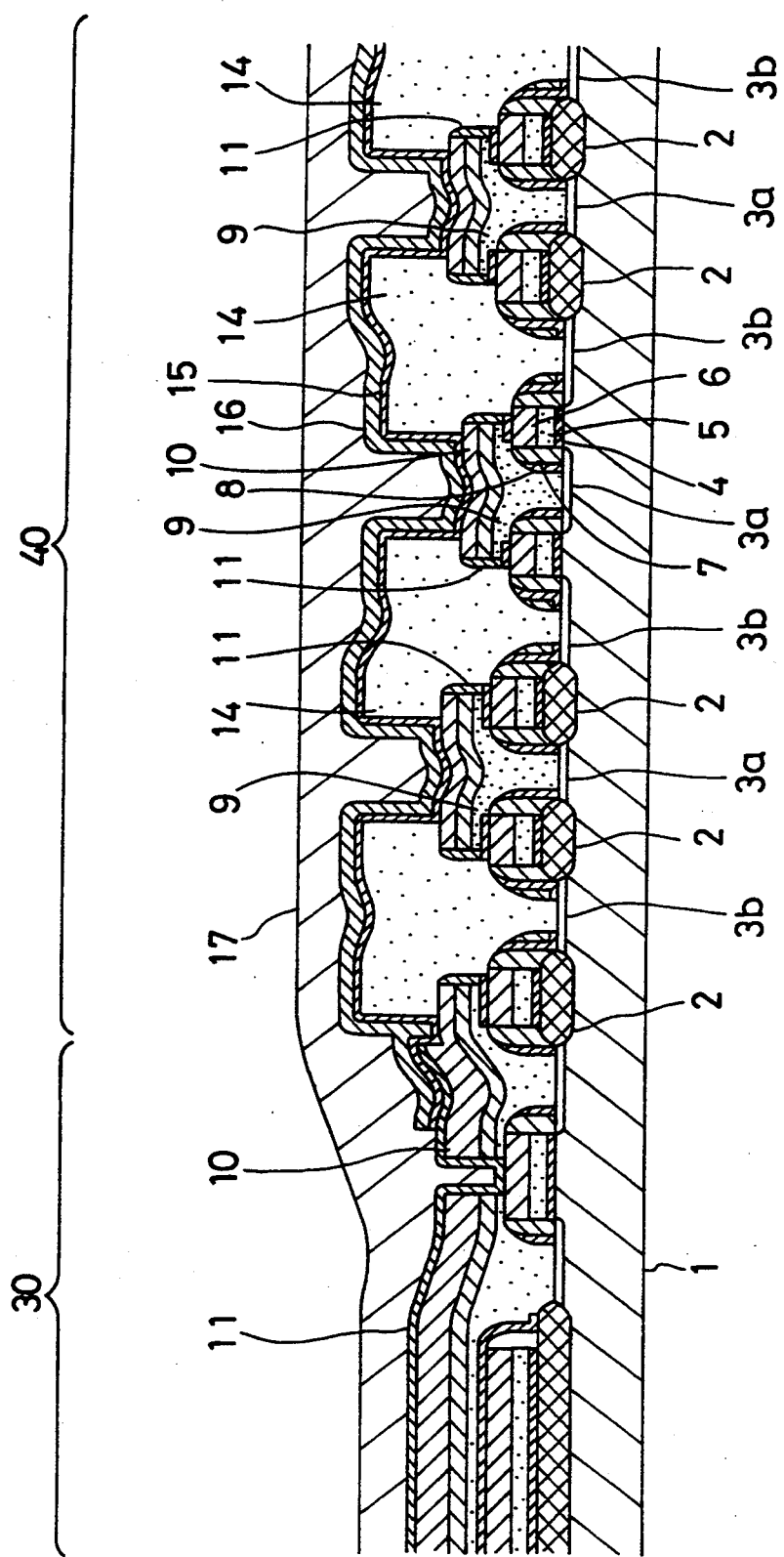
FIG. 4 is a cross section taken along the line A—A of FIG. 9, which illustrates still another step according to the method of manufacturing a semiconductor memory device in the above first embodiment.

Next, as shown in FIG. 4, a third insulating film 17 composed of a BPSG film is deposited to a thickness of 800 nm. The resulting third insulating film 17 is allowed to reflow by 30-minute annealing in an atmosphere of nitrogen at 900° C., so that the maximum tilt angle of the third insulating film 17 can be reduced to about 30° in a step region 50 between the memory cell array region 40 and peripheral circuit region 30, which greatly facilitates the subsequent formation of a wiring pattern thereon.

As described above, according to the first embodiment, the insulating film on the bit line 9 in the memory cell array region 40 is selectively removed so as to form the opening 13 for a charge-storage electrode by the self-aligning method, so that, even when a stack-type cell of simple structure is formed high, the difference in level between the memory cell array region 40 and peripheral circuit region 30 can effectively be reduced, thereby facilitating the subsequent formation of a wiring pattern with fine features.

EXAMPLE 2

Figure 10:
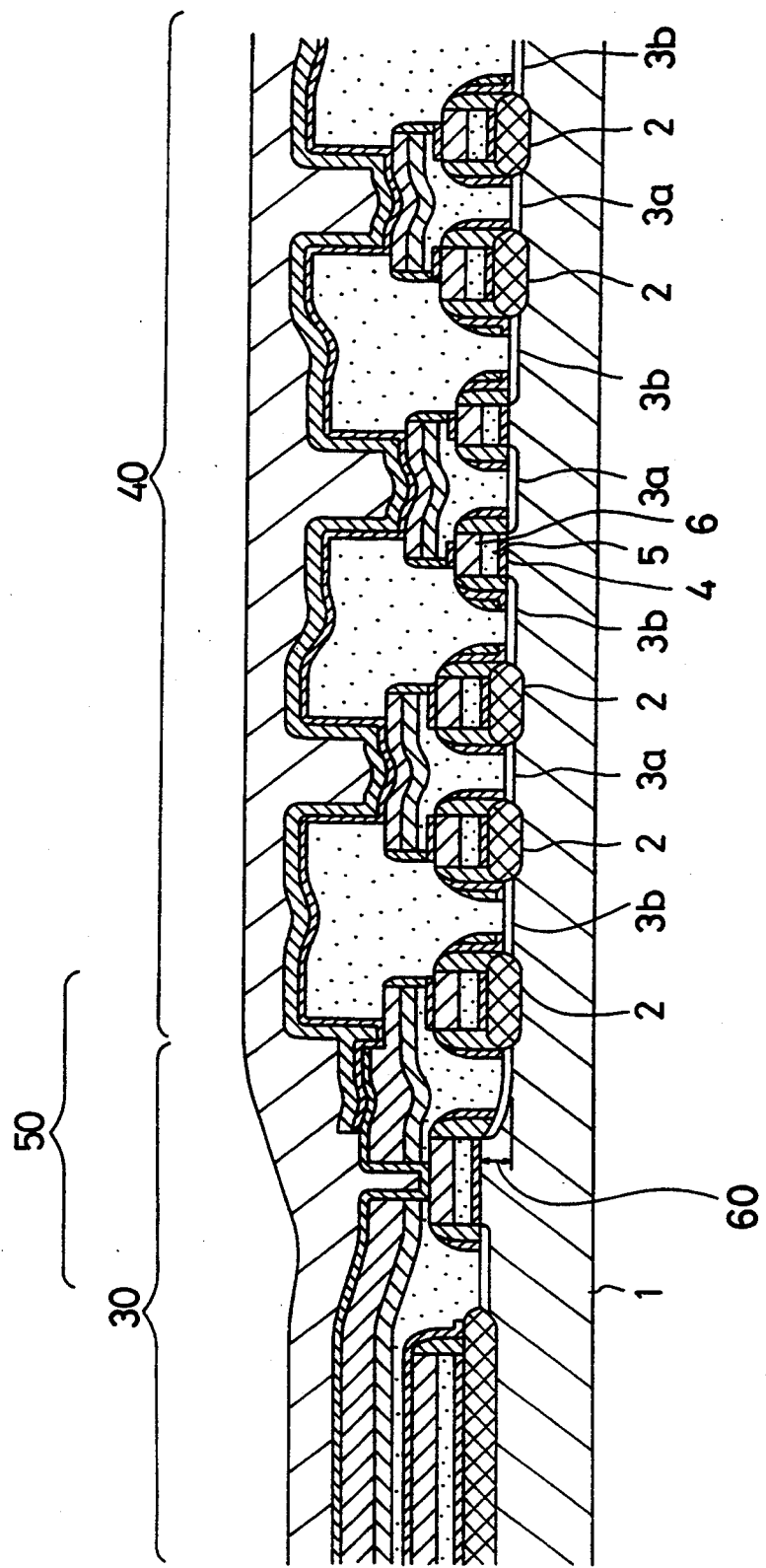
FIG. 10 is a cross section of a semiconductor memory device according to a second embodiment of the present invention.

FIG. 10 is a cross section of a semiconductor memory device according to a second embodiment of the present invention.

As shown in FIG. 10, in the memory cell array region 40 of the semiconductor memory device according to the second embodiment, the p-type semiconductor substrate 1 is grooved to a depth of 200 nm so as to form a groove portion 60. On the p-type semiconductor substrate 1 formed with the groove portion 60 is formed the memory cell array region 40 and peripheral circuit region 30, similarly to the first embodiment. As for other structures of the present second embodiment, they are the same as those of the first embodiment, so that the description thereof will be omitted here by providing the same reference numerals as those used in the first embodiment.

According to the second embodiment, the effect of reducing the difference in level shown in the first embodiment is combined with the effect of reducing the difference in level of the groove portion 60 which is 200 nm in depth, thereby substantially reducing the difference in level between the memory cell array region 40 and peripheral circuit region 30 by about 400 nm, so that the subsequent formation of a wiring pattern with fine features can be performed more easily.

EXAMPLE 3

Figure 11:
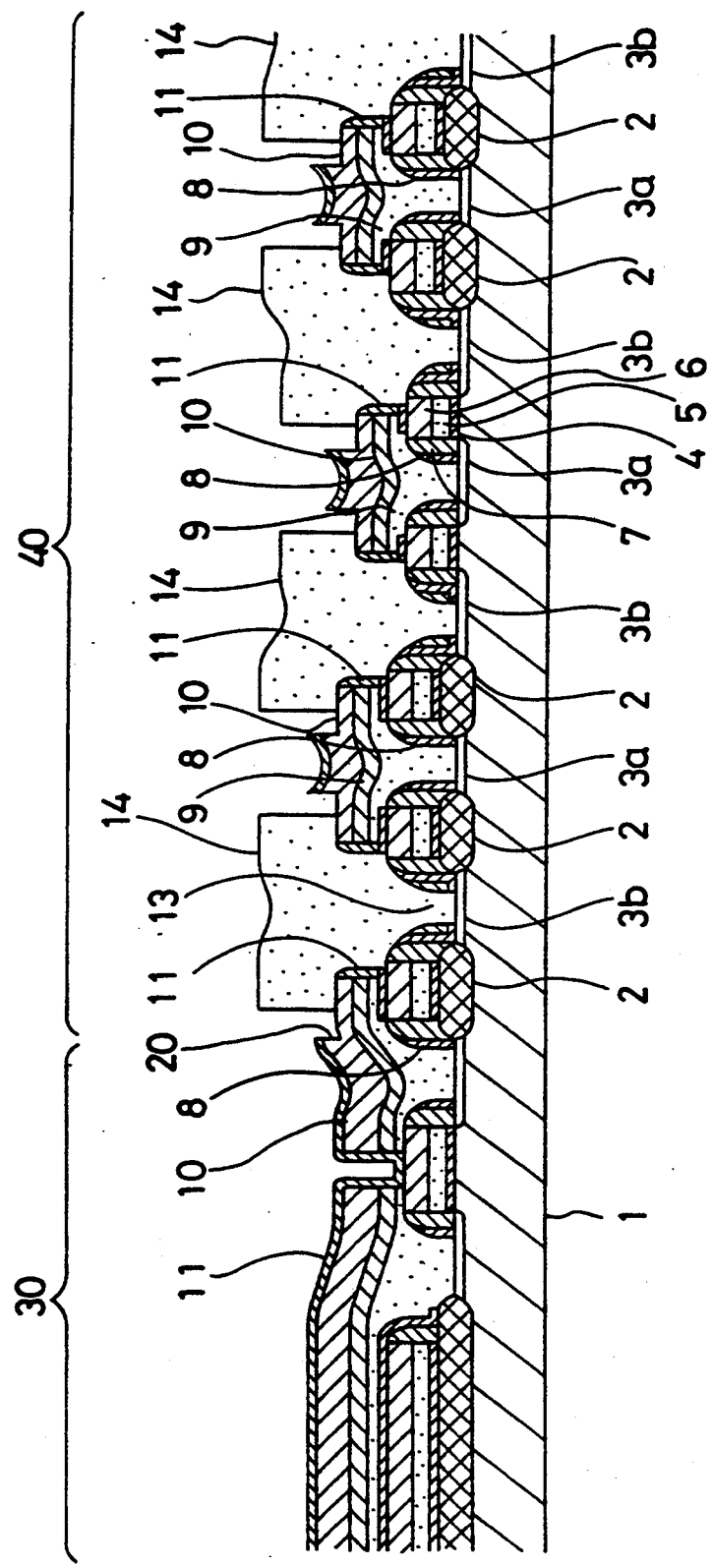
FIG. 11 is a cross section taken along the line A—A of FIG. 9, which illustrates a step according to a method of manufacturing a semiconductor memory device in a third embodiment of the present invention.
Figure 12:
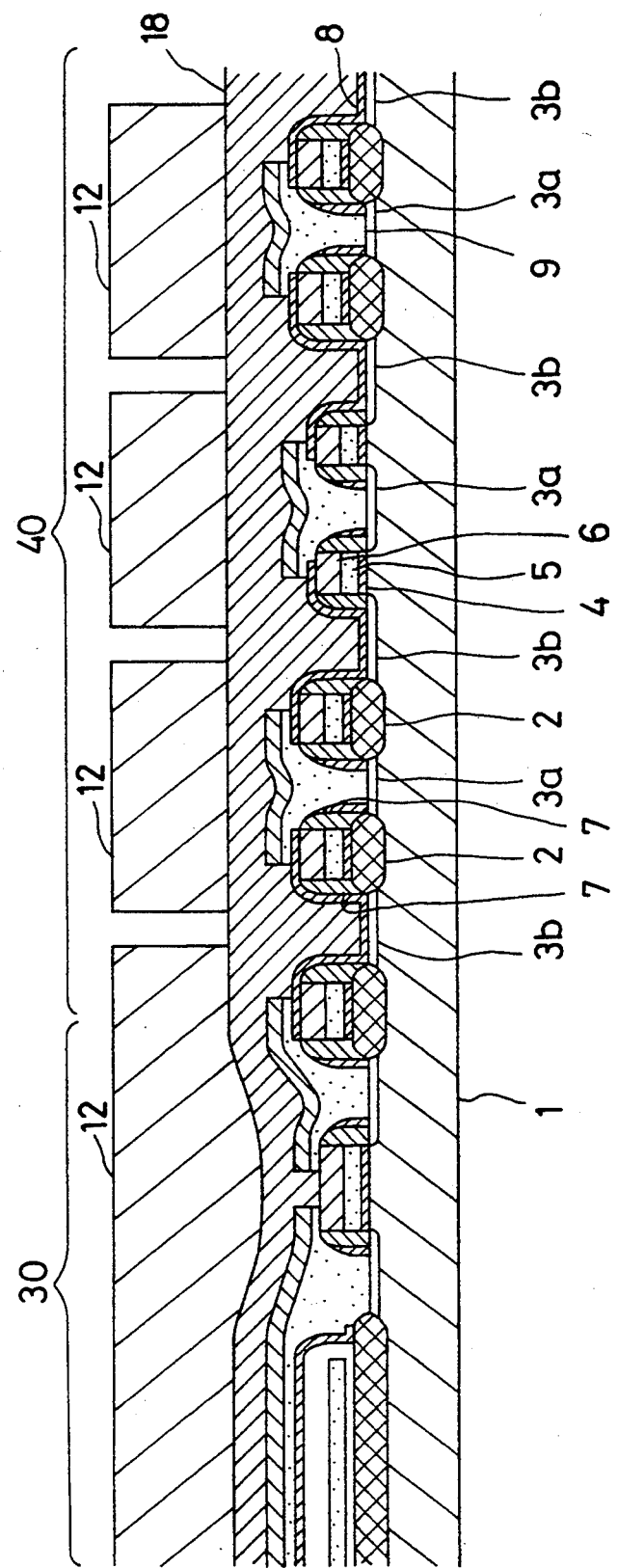
FIG. 12 is a cross section for illustrating a step according to a conventional method of manufacturing a semiconductor device.
Figure 13:
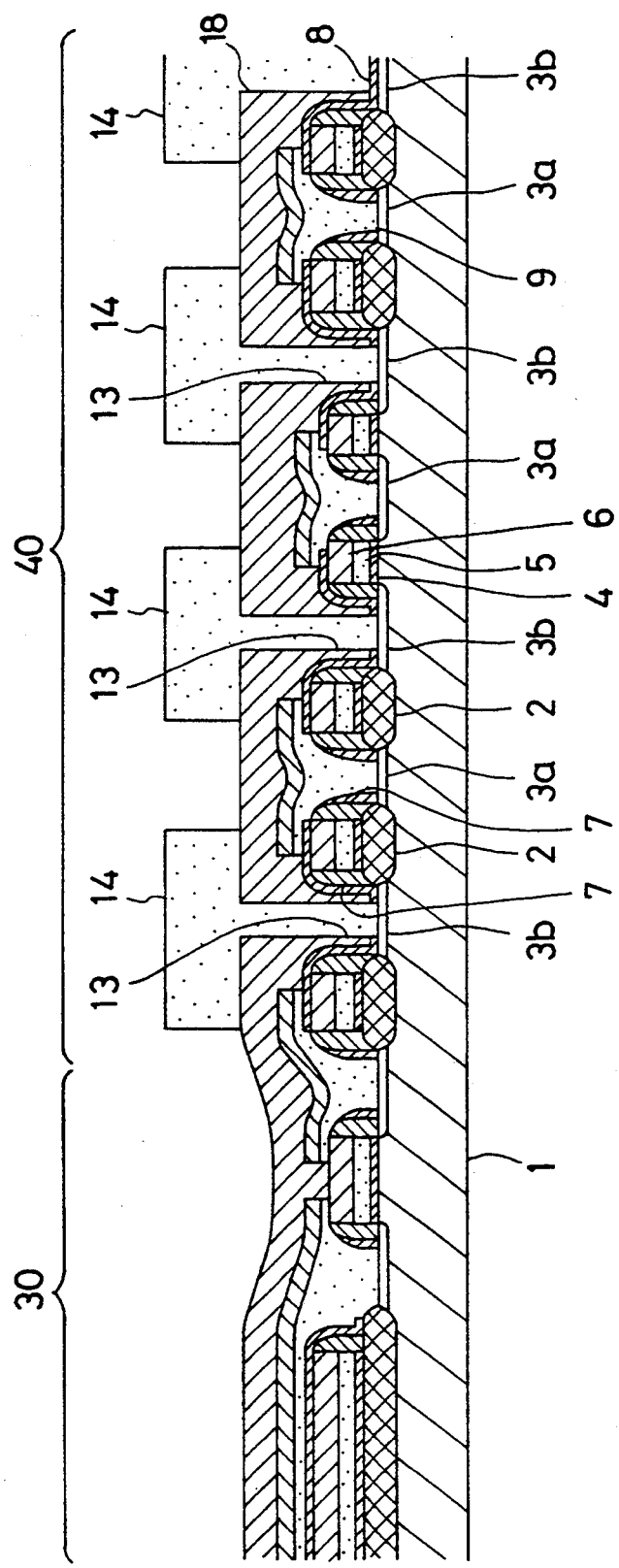
FIG. 13 is a cross section for illustrating another step according to the conventional method of manufacturing a semiconductor device.
Figure 14:
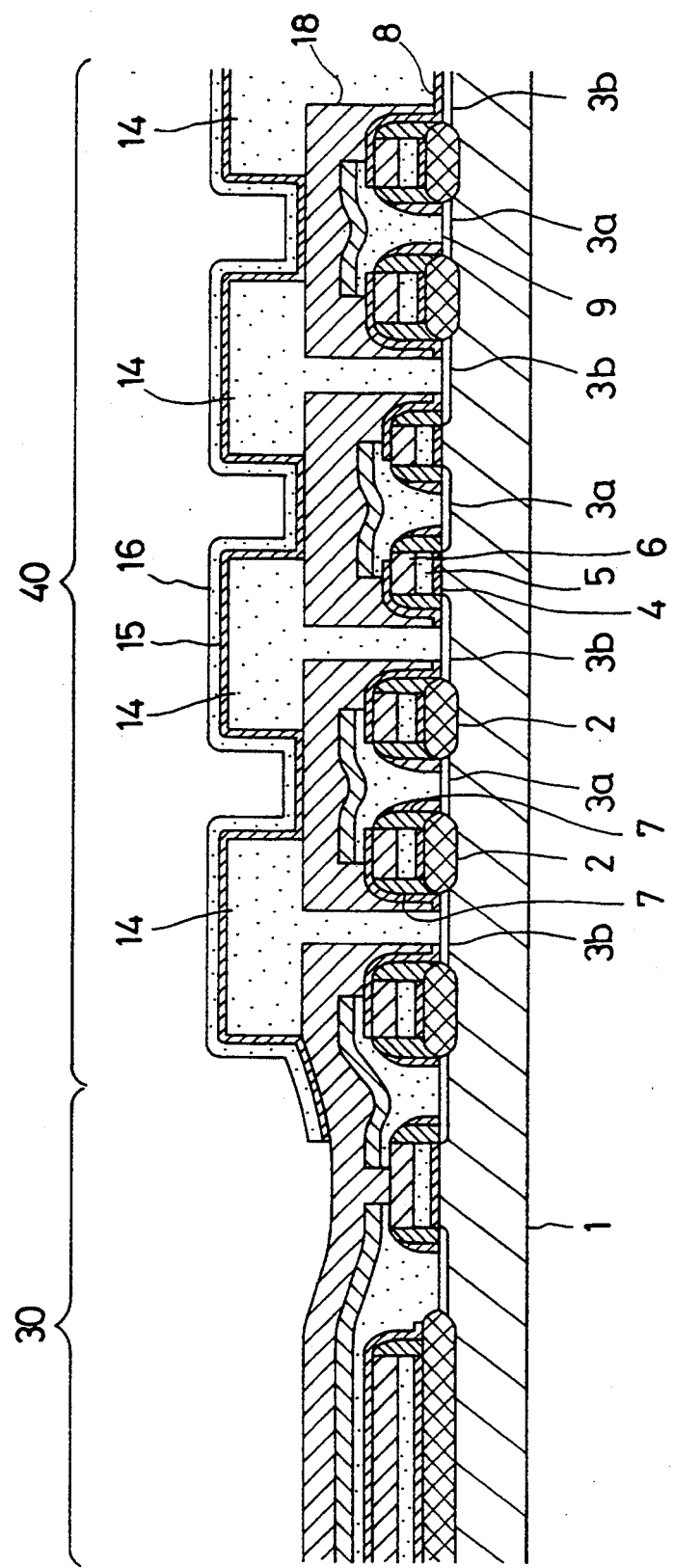
FIG. 14 is a cross section for illustrating still another step according to the conventional method of manufacturing a semiconductor device.
Figure 15:
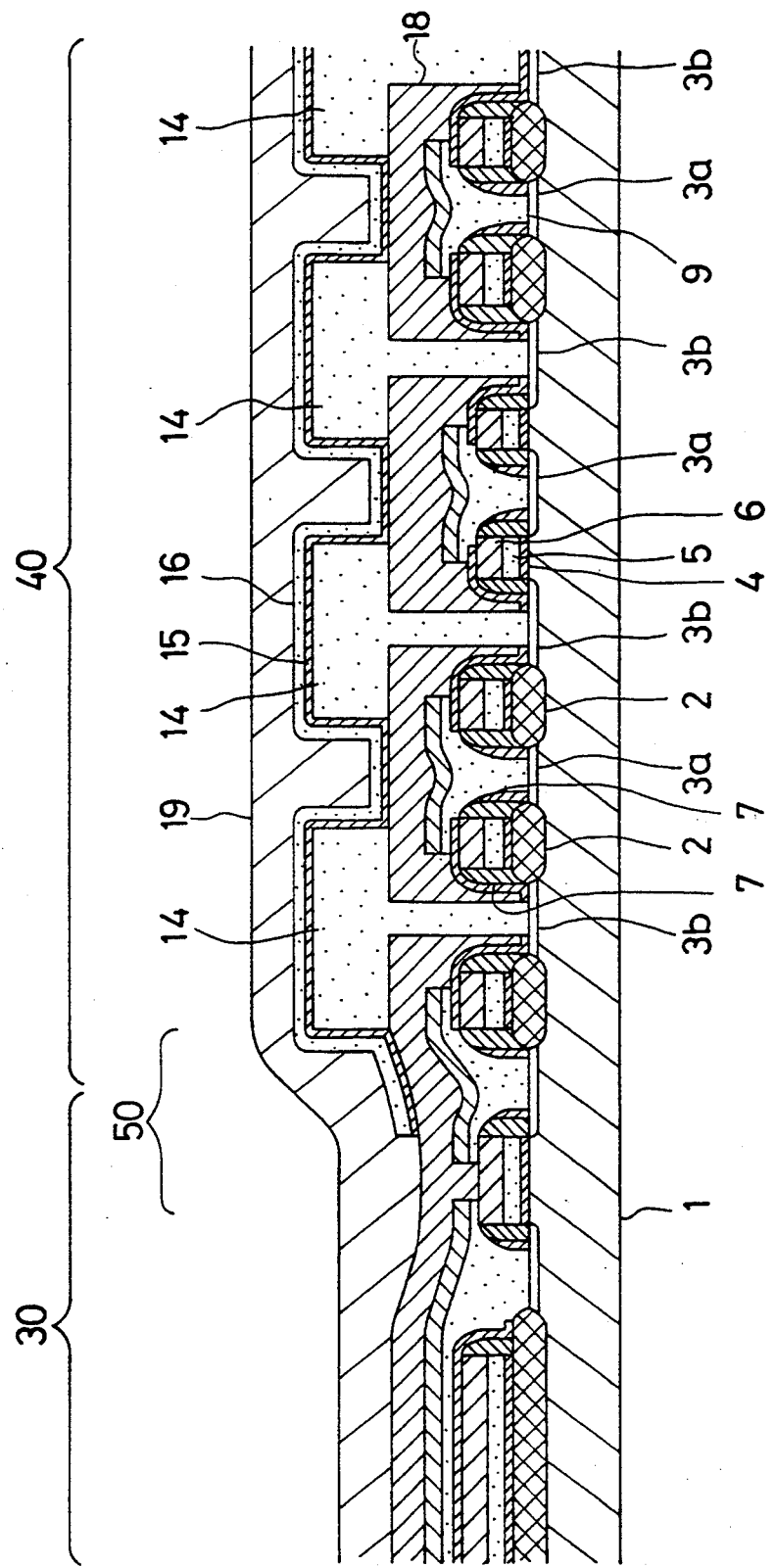
FIG. 15 is a cross section for illustrating still another step according to the conventional method of manufacturing a semiconductor device.

FIG. 11 is a cross section of a semiconductor memory device according to a third embodiment of the present invention.

In the first embodiment, tile insulating film over the entire memory cell array region 40 was etched away so as to form the opening 13 for a charge-storage electrode. In the third embodiment, however, the insulating film lying in the region where at least the charge-storage electrode 14 is to be formed in the memory cell array region 40 is selectively etched away to form the opening 13 for a charge-storage electrode, as shown in FIG. 11. In the region grooved by etching is formed the charge-storage electrode 14. As for other structures of the present third embodiment, they are the same as those of the first embodiment, so that the description thereof will be omitted here by providing the same reference numerals as those used in the first embodiment.

According to the third embodiment, the same effect of reducing the difference in level as that shown in the first embodiment is obtained and the subsequent formation of a wiring pattern with fine features can easily be performed, while the on-bit-line insulating film 10 can be left thick in the region where the charge-storage electrode 14 is not to be formed. Consequently, it becomes possible to decrease the electrostatic capacity between the plate electrode (See FIG. 3. It is not shown in FIG. 11), which will be formed later, and the bit line 9, thereby improving the S/N ratio in a read operation.

I claim:

1. A semiconductor memory device comprising a word line, a bit line, and a charge-storage electrode which are formed on its semiconductor substrate, an insulating film which is formed on the top surface of said bit line, and a capacitance insulating film which is formed on said charge-storage electrode, wherein:

said insulating film has a step portion which is lower in level than other portions;

said charge-storage electrode is formed on the bottom surface of said step portion, leaving a space between a wall surface of said step portion and said charge-storage electrode; and said capacitance insulating film is formed in said space.

* * * * *